(12) United States Patent
Cha et al.

(10) Patent No.: US 11,024,696 B2
(45) Date of Patent: Jun. 1, 2021

(54) DISPLAY APPARATUS HAVING A REDUCED NON-DISPLAY AREA

(71) Applicant: Samsung Display Co., Ltd., Yongin-si (KR)

(72) Inventors: Myounggeun Cha, Yongin-si (KR); Yongsu Lee, Yongin-si (KR); Sanggun Choi, Yongin-si (KR); Jiyeong Shin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 69 days.

(21) Appl. No.: 16/510,614

(22) Filed: Jul. 12, 2019

(65) Prior Publication Data
US 2020/0083311 A1    Mar. 12, 2020

(30) Foreign Application Priority Data
Sep. 10, 2018  (KR) .................. 10-2018-0107887

(51) Int. Cl.
*H01L 27/32*     (2006.01)
*H01L 51/00*     (2006.01)
*H01L 27/12*     (2006.01)

(52) U.S. Cl.
CPC ...... *H01L 27/3276* (2013.01); *H01L 27/3258* (2013.01); *H01L 27/3262* (2013.01); *H01L 27/3272* (2013.01); *H01L 51/0097* (2013.01); *H01L 27/124* (2013.01); *H01L 27/1248* (2013.01); *H01L 2227/323* (2013.01); *H01L 2251/5338* (2013.01)

(58) Field of Classification Search
CPC combination set(s) only.
See application file for complete search history.

(56) References Cited

U.S. PATENT DOCUMENTS

| | | | |
|---|---|---|---|
| 9,136,315 B1* | 9/2015 | Kim | ............ H01L 27/3276 |
| 9,530,800 B2 | 12/2016 | Wang et al. | |
| 9,991,287 B2 | 6/2018 | Lim et al. | |
| 10,140,039 B1 | 11/2018 | Baruch et al. | |
| 2016/0141545 A1* | 5/2016 | Kim | ............ H01L 51/5253 |
| | | | 257/40 |
| 2018/0145123 A1 | 5/2018 | Kim et al. | |

FOREIGN PATENT DOCUMENTS

| KR | 10-2017-0096007 A | 8/2017 |
|---|---|---|
| KR | 10-2017-0126535 A | 11/2017 |
| KR | 10-2018-0057764 A | 5/2018 |

* cited by examiner

*Primary Examiner* — Nduka E Ojeh
(74) *Attorney, Agent, or Firm* — Lewis Roca Rothgerber Christie LLP

(57) ABSTRACT

A display apparatus has a display area and a non-display area around the display area, the display apparatus includes, in the non-display area, a first power line, a driving circuit on a layer over the first power line, and a second power line electrically connected to the first power line and on a same layer on which one electrode of the driving circuit is arranged.

20 Claims, 15 Drawing Sheets

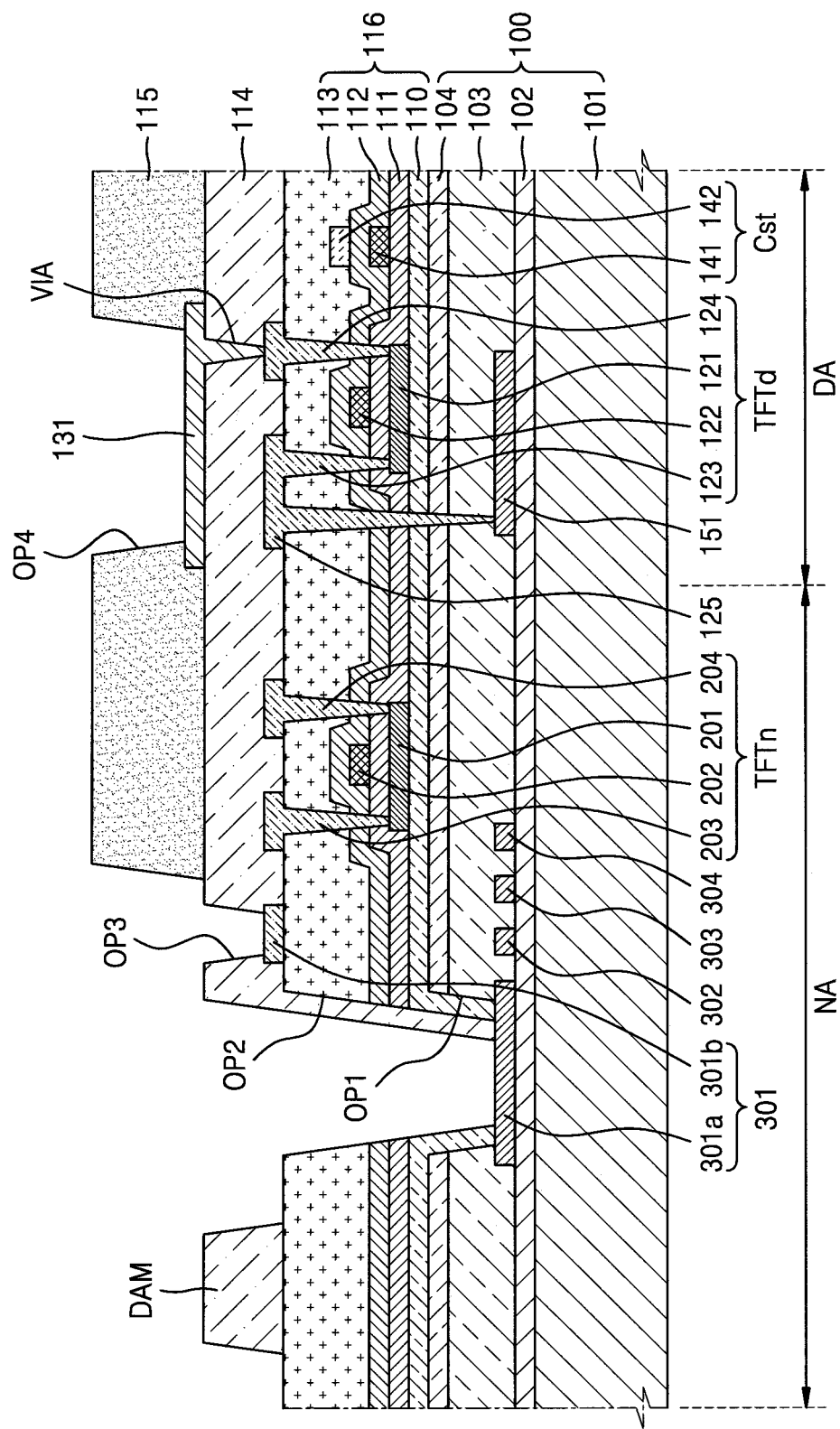

DISPLAY APPARATUS HAVING A REDUCED NON-DISPLAY AREA

CROSS-REFERENCE TO RELATED PATENT APPLICATION

This application claims priority to and the benefit of Korean Patent Application No. 10-2018-0107887, filed on Sep. 10, 2018, in the Korean Intellectual Property Office, the disclosure of which is incorporated herein in its entirety by reference.

BACKGROUND

1. Field

Aspects of the present invention relate to display apparatuses.

2. Description of the Related Art

Display apparatuses, such as organic light-emitting displays and liquid crystal displays, include a plurality of pixels arranged in a display area, and a driving circuit and power lines arranged in a non-display area.

As demand for display apparatuses that are compact and have high resolution has recently increased, the relative amount space occupied by the driving circuit and the power lines of the non-display area has increased. Therefore, there is demand for an efficient space layout between the driving circuit and wires.

SUMMARY

Aspects of embodiments are directed to a display apparatus having a reduced or minimized non-display area.

Additional aspects will be set forth in part in the description which follows will be apparent from the description, or may be learned by practice of the presented embodiments.

According to some embodiments, there is provided a display apparatus having a display area and a non-display area around the display area, the display apparatus including, in the non-display area: a first power line; a driving circuit on a layer over the first power line; and a second power line electrically connected to the first power line and on a same layer on which one electrode of the driving circuit is arranged.

In some embodiments, the display apparatus further includes a display device in the display area and including a pixel electrode, an opposite electrode, and an emission layer between the pixel electrode and the opposite electrode.

In some embodiments, the opposite electrode is electrically connected to the first power line and the second power line.

In some embodiments, the first power line overlaps a portion of the driving circuit.

In some embodiments, the second power line overlaps a portion of the first power line.

In some embodiments, the driving circuit includes at least one thin film transistor, and the second power line is on a same layer on which at least one of a gate electrode, a source electrode, and a drain electrode of the at least one thin film transistor of the driving circuit is arranged.

In some embodiments, the display apparatus further includes a first connecting electrode on a layer between the first power line and the second power line, the first connecting electrode electrically connecting the first power line to the second power line.

In some embodiments, the display apparatus further includes a second connecting electrode on a layer over the second power line and electrically connecting the second power line to the opposite electrode.

In some embodiments, the display apparatus further includes, in the display area: a shielding layer on a same layer on which the first power line is arranged; and a pixel circuit on a layer over the shielding layer and at least partially overlapping the shielding layer.

In some embodiments, the shielding layer is electrically connected to one electrode of the pixel circuit.

In some embodiments, the display apparatus further includes an organic layer and an inorganic layer between the first power line and the driving circuit.

In some embodiments, the display apparatus further includes a third power line being apart from the first power line on a same layer on which the first power line is arranged.

In some embodiments, the display apparatus further includes a fourth power line apart from the second power line on a same layer on which the second power line is arranged.

According to some embodiments, there is provided a display apparatus including: a substrate including a display area and a non-display area; a pixel on the display area and including a pixel circuit and a display device; at least one power line on the non-display area; and a driving circuit on the non-display area and at least partially overlapping the at least one power line.

In some embodiments, the at least one power line includes: a first power line on a layer below the driving circuit; and a second power line on a same layer on which one electrode of the driving circuit is arranged, and electrically connected to the first power line.

In some embodiments, the first power line and the second power line are electrically connected to one electrode of the display device of the pixel.

In some embodiments, the driving circuit includes at least one thin film transistor, and the second power line is on a same layer on which at least one of a gate electrode, a source electrode, and a drain electrode of the at least one thin film transistor of the driving circuit is arranged.

In some embodiments, the display apparatus further includes a connecting electrode between the first power line and the second power line and electrically connect the first power line to the second power line.

In some embodiments, the substrate includes: a first organic layer; a first inorganic layer on the first organic layer; a second organic layer on the first inorganic layer; and a second inorganic layer on the second organic layer, wherein the first power line is between the first organic layer and the second organic layer, and wherein the driving circuit is over the second inorganic layer.

In some embodiments, the display apparatus further includes a shielding layer on a layer below the pixel, wherein the shielding layer is on a same layer on which the first power line is arranged.

BRIEF DESCRIPTION OF THE DRAWINGS

These and/or other aspects will become apparent and more readily appreciated from the following description of the embodiments, taken in conjunction with the accompanying drawings in which:

FIGS. 4A-4G are schematic cross-sectional views illustrating a method of manufacturing the display apparatus of FIG. 3.

DETAILED DESCRIPTION

Figure 1:
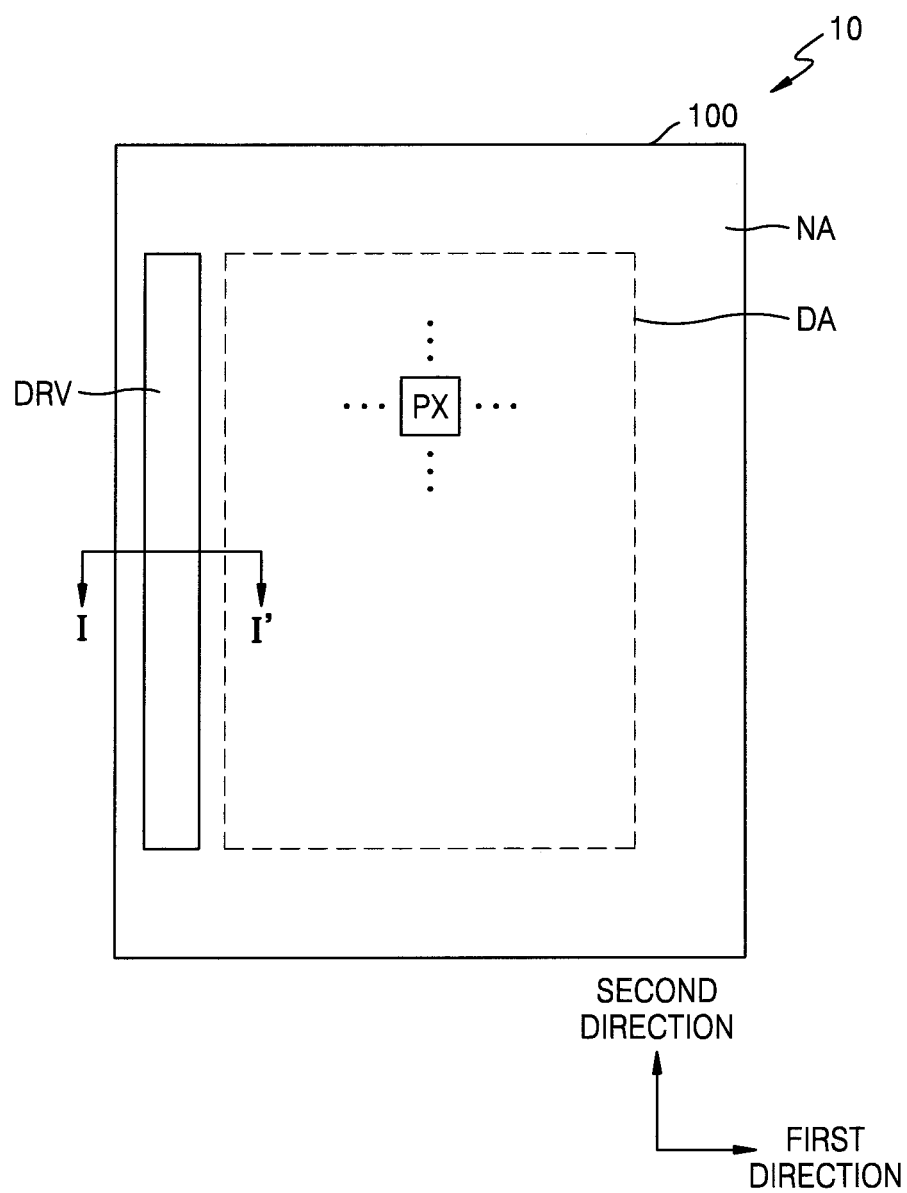
FIG. 1 is a schematic view of a display apparatus according to an example embodiment.

The disclosure allows for various suitable changes and numerous embodiments, and some embodiments will be illustrated in the drawings and described in detail in the written description. Hereinafter, effects and features of the present disclosure and a method for accomplishing them will be described more fully with reference to the accompanying drawings, in which some embodiments of the disclosure are shown. This disclosure may, however, be embodied in many different forms and should not be construed as limited to the embodiments set forth herein.

It will be understood that when a layer, region, or component is referred to as being "formed on" another layer, region, or component, it can be directly or indirectly formed on the other layer, region, or component. That is, for example, intervening layers, regions, or components may be present.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the terms "use," "using," and "used" may be considered synonymous with the terms "utilize," "utilizing," and "utilized," respectively.

The driving circuit and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the driving circuit may be formed on one integrated circuit (IC) chip or on separate IC chips. Further, the various components of the driving circuit may be implemented on a flexible printed circuit film, a tape carrier package (TCP), a printed circuit board (PCB), or formed on a same substrate. Further, the various components of the driving circuit may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

One or more embodiments of the disclosure will be described below in more detail with reference to the accompanying drawings. Those components that are the same or are in correspondence are given the same reference numeral regardless of the figure number, and repeat explanations may not be provided.

FIG. 1 is a schematic view of a display apparatus 10 according to an example embodiment.

Referring to FIG. 1, a substrate 100 of the display apparatus 10 may include a display area DA and a non-display area NA around (e.g., surrounding/framing) the display area DA. On the display area DA of the substrate 100, a plurality of pixels PX may be arranged. On the non-display area NA of the substrate 100, a driving circuit DRV and various wires for transmitting electrical signals may be positioned.

The display apparatus 10 may be a liquid crystal display (LCD), an organic light-emitting display, an electrophoretic display, an electrowetting display panel, or the like. An organic light-emitting display will now be described as an example.

The substrate 100 may include a pair of sides parallel to each other in a first direction, and a pair of sides parallel to each other in a second direction. The substrate 100 may have an approximately rectangular shape as shown in FIG. 1, but embodiments are not limited thereto. For example, the substrate 100 may be provided in various suitable shapes, such as a close-type polygon including straight sides, a circle or an oval each including curved sides, a semi-circle or a semi-oval each including straight sides and curved sides, or the like. According to an embodiment, when the substrate 100 has straight sides, at least some of the corners of each of the aforementioned shapes may be curved. For example, when the substrate 100 has a substantially rectangular shape, an intersection between adjacent straight sides may be replaced by a curved line having a certain curvature. In other words, an otherwise vertex portion of the rectangular shape may be formed as a curved side including both ends connected to adjacent two straight sides and having a certain curvature. The curvature may be set differently according to locations of the curved line of the substrate 100. For example, the curvature may change according to, for example, a location where a curved line starts and a length of the curved line.

The display area DA may have a shape corresponding to the shape of the substrate 100. For example, similar to the shape of the substrate 100, the display area DA may be provided in various suitable shapes, such as a close-type polygon including straight sides, a circle or an oval each including curved sides, and a semi-circle or a semi-oval each including straight sides and curved sides. According to an embodiment, when the display area DA has straight sides, at least some of the corners of each of the aforementioned shapes may be curved.

On the display area DA, the plurality of pixels PX may be arranged (e.g., in matrix form) in the first direction and the second direction according to a certain pattern. Each pixel PX may include a display device, and a pixel circuit electrically connected to the display device. The pixel circuit may include at least one thin film transistor (TFT) and at least one capacitor. The display device may be an organic light-emitting device (OLED). The display area DA is an area where an image is displayed.

The non-display area NA is an area where no pixels PX are arranged, and is thus an area where no images are displayed. On the non-display area NA, the driving circuit DRV for driving the pixels PX may be arranged. The driving circuit DRV may include at least one of a scan driving unit (e.g., a scan driver) that provides scan signals to the pixels PX, a data driving unit (e.g., a data driver) that provides data signals to the pixels PX, and a controller that controls the scan driving unit and the data driving unit.

The driving circuit DRV may be mounted directly on the substrate 100. The driving circuit DRV may be formed on the substrate 100 concurrently (e.g., simultaneously) with formation of the pixels PX. According to another embodiment, the driving circuit DRV may be formed on a special chip and then mounted on the substrate 100, or may be mounted on a special printed circuit board (PCB) and then connected to the substrate 100 via a connection member.

An encapsulation member including one or more thin films may be arranged on the substrate 100. According to an embodiment, the encapsulation member may include a plurality of thin films and may prevent external moisture and/or air from permeating into the display area DA or substantially reduce incidence thereof. The encapsulation member may cover the display area DA and may extend to the non-display area NA. The encapsulation member may include at least one inorganic layer including inorganic material, and at least one organic layer including organic material. According to some embodiments, the encapsulation member may have a structure in which a first inorganic layer, an organic layer, and a second inorganic layer are stacked on each other.

Various suitable functional layers, such as a polarization layer for reducing external light reflection, a black matrix, a color filter, and/or a touch screen layer including a touch electrode, may be arranged on the encapsulation member. A window may be arranged on the encapsulation member and may be coupled thereto via a pressure sensitive adhesive (PSA).

Figure 2:
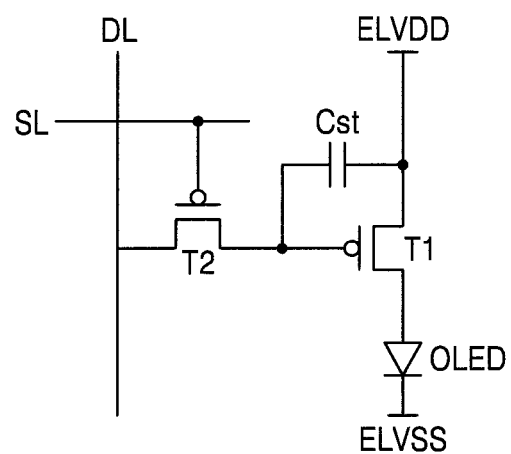
FIG. 2 is a circuit diagram of a pixel illustrated in FIG. 1.

FIG. 2 is a circuit diagram of a pixel PX illustrated in FIG. 1.

Referring to FIG. 2, the pixel PX may include a first transistor T1, a second transistor T2, and a capacitor Cst.

The first transistor T1 includes a first electrode that receives a first power supply voltage ELVDD, and a second electrode that is connected to a first electrode of an OLED. A gate electrode of the first transistor T1 is connected to a second electrode of the second transistor T2. A gate electrode of the second transistor T2 is connected to a scan line SL, and a first electrode thereof is connected to a data line DL. The capacitor Cst has a first electrode that is connected to the gate electrode of the first transistor T1, and a second electrode that receives the first power supply voltage ELVDD. A second power supply voltage ELVSS may be lower than the first power supply voltage ELVDD.

Although the single pixel PX includes two transistors and one capacitor in FIG. 2, embodiments are not limited thereto. Accordingly, a display apparatus may include more than two transistors and more than one capacitor in each pixel PX, and may be formed to have any of various suitable structures in which special wires are further formed or existing wires are omitted.

Figure 3:
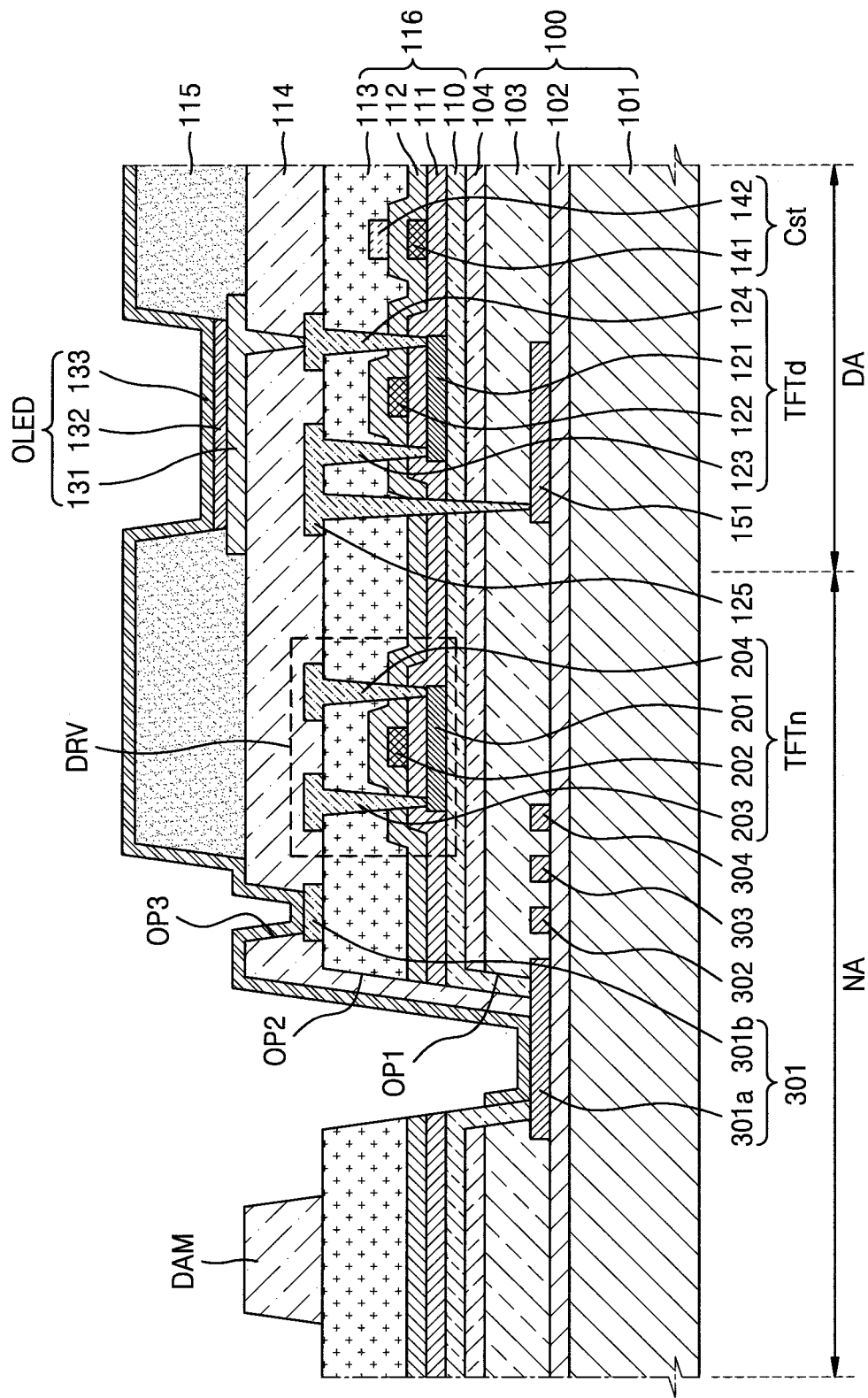
FIG. 3 is a cross-sectional view taken along the line I-I' of FIG. 1.

FIG. 3 is a cross-sectional view taken along the line I-I' of FIG. 1.

Referring to FIG. 3, the plurality of pixels PX may be arranged on the display area DA of the substrate 100, and the driving circuit DRV, a power unit, and a dam DAM may be arranged on the non-display area NA of the substrate 100.

The power unit includes a plurality of power lines for providing a voltage to the pixels PX and/or the driving circuit DRV.

The substrate 100 may be a flexible substrate. For example, the substrate 100 may be a plastic substrate. The substrate 100 may be an insulating substrate including an organic material. The substrate 100 may have a structure in which a first layer 101, a second layer 102, a third layer 103, and a fourth layer 104 are sequentially stacked. Flexible substrates having this stacked structure may have a low oxygen transmittance and a low moisture transmittance compared to flexible substrates formed of only an organic material, and may have high durability. The substrate 100 may be a transparent substrate, namely, a light-transmitting substrate.

A first thickness of the first layer 101 may be equal to a third thickness of the third layer 103. A second thickness of the second layer 102 may be equal to a fourth thickness of the fourth layer 104. The first thickness of the first layer 101 and the third thickness of the third layer 103 may be greater than the second thickness of the second layer 102 and the fourth thickness of the fourth layer 104.

The first and third layers 101 and 103 may be organic layers including organic materials. The first layer 101 and the third layer 103 may include polyethersulphone (PES), polyacrylate, polyetherimide (PEI), polyethylene naphthalate (PEN), polyethylene terephthalate (PET), polyphenylene sulfide (PPS), polyarylate (PAR), polyimide (Pl), polycarbonate (PC), cellulose triacetate (CTA or TAC), cellulose acetate propionate (CAP), and/or the like.

The second and fourth layers 102 and 104 may be inorganic layers including inorganic materials. The second layer 102 and the fourth layer 104 may include silicon oxide ($SiO_2$), silicon nitride (SiNx), and/or the like. The second layer 102 and the fourth layer 104 may each be a single layer or a multi-layer in which silicon oxide ($SiO_2$) and silicon nitride (SiNx) are alternately and repeatedly stacked on each other. The first and second layers 102 and 104 may function as barrier layers that prevent moisture and/or oxygen from permeating into the substrate 100 or substantially reduce instances thereof.

A buffer layer 110 may be further formed on the substrate 100. The buffer layer 110 may be formed of at least one of an organic layer and an inorganic layer. For example, the buffer layer 110 may perform functions of blocking impure elements from being permeated through the substrate 100 and planarizing the surface of the substrate 100, and may be formed of an inorganic material, such as silicon oxide ($SiO_2$) and/or silicon nitride (SiNx) in a single-layer or multi-layer structure. The buffer layer 110 may be formed on the fourth layer 104, which is an uppermost layer of the substrate 100. In some examples, the buffer layer 110 may be omitted.

A pixel PX of the display area DA may include a transistor TFTd, a capacitor Cst, and an OLED being a display device.

The transistor TFTd of the pixel PX may include a semiconductor layer 121, a gate electrode 122, a source electrode 123, and a drain electrode 124. The transistor TFTd may be a driving transistor from among a plurality of transistors included in the pixel PX. The transistor TFTd may be a TFT.

The semiconductor layer 121 may be arranged on the buffer layer 110. The semiconductor layer 121 may include various suitable materials. For example, the semiconductor layer 121 may include an inorganic semiconductor material such as amorphous silicon, crystalline silicon, and/or the like. As another example, the semiconductor layer 121 may contain an oxide semiconductor or an organic semiconductor material. The semiconductor layer 121 may include a source region and a drain region on both ends thereof, and a channel region facing the gate electrode 122 and being in between the source region and the drain region.

The gate electrode 122 may be arranged over the semiconductor layer 121. The gate electrode 122 may include various suitable conductive materials. For example, the gate electrode 122 may include at least one selected from aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu) in a single-layered or multi-layered structure.

A first insulating layer 111 may be between the semiconductor layer 121 and the gate electrode 122. The first insulating layer 111 may be an inorganic insulating layer. The first insulating layer 111 may be formed of at least one insulating material selected from $SiO_2$, $SiN_x$, SiON, $Al_2O_3$, $TiO_2$, $Ta_2O_5$, $HfO_2$, $ZrO_2$, barium strontium titanate (BST), and lead zirconate titanate (PZT) in a single-layered or multi-layered structure.

The source electrode 123 and the drain electrode 124 contacting opposite ends of the semiconductor layer 121 may be arranged on the gate electrode 122. The source electrode 123 and the drain electrode 124 may include various suitable conductive materials. For example, the source electrode 123 and the drain electrode 124 may each be formed of at least one selected from aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu) in a single-layered or multi-layered structure. The source electrode 123 and the drain electrode 124 may contact the semiconductor layer 121 through contact openings (or contact holes) formed in the first insulating layer 111 and a second insulating layer 112 and respectively exposing both ends of the semiconductor layer 121.

The second insulating layer 112 and a third insulating layer 113 may be arranged between the gate electrode 122 and each of the source electrode 123 and the drain electrode 124. The second insulating layer 112 and the third insulating layer 113 may be inorganic insulating layers. The second insulating layer 112 and the third insulating layer 113 may each be formed of at least one of $SiO_2$, SiNx, SiON, $Al_2O_3$, $TiO_2$, $Ta_2O_5$, $HfO_2$, $ZrO_2$, BST, and PZT in a single- or multi-layered structure.

A shielding layer 151, of which at least a portion overlaps the semiconductor layer 121, may be provided below the transistor TFTd. The shielding layer 151 may be included on the second layer 102 of the substrate 100 and may be located between the second layer 102 and the third layer 103. The shielding layer 151 may be electrically connected to one electrode of the transistor TFTd, for example, to the source electrode 123. The shielding layer 151 may contract a first connecting electrode 125 extending from the source electrode 123, and thus may be connected to the source electrode 123.

The shielding layer 151 may include at least one of aluminum (Al), copper (Cu), silver (Ag), molybdenum (Mo), chromium (Cr), tungsten (W), titanium (Ti), and an alloy thereof, and may be formed as a single layer or multi-layer structure. According to an embodiment, the shielding layer 151 may be a multi-layered structure including Mo. According to another embodiment, the shielding layer 151 may be a three-layered structure having a first layer, a second layer, and a third layer sequentially stacked on the second layer 102, the first and third layers including Ti and the second layer including Al.

The capacitor Cst may include a first capacitor electrode 141 and a second capacitor electrode 142. The second insulating layer 112 may be arranged between the first capacitor electrode 141 and the second capacitor electrode 142. The first capacitor electrode 141 may include the same or substantially the same material as the gate electrode 122 of the transistor TFTd. The first capacitor electrode 141 may be formed of at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu) in a single-layered or multi-layered structure. The second capacitor electrode 142 may be formed of at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu) in a single-layered or multi-layered structure. The third insulating layer 113 may be arranged on the second capacitor electrode 142.

A fourth insulating layer 114 may be arranged on the source electrode 123 and the drain electrode 124. The fourth insulating layer 114 may be an organic insulating layer. The fourth insulating layer 114 may include a polyacrylic compound, a polyimide compound, a fluorocarbon compound (such as, Teflon), a benzocyclobutene compound, and/or the like. A protection layer may be further included between the fourth insulating layer 114 and each of the source electrode 123 and the drain electrode 124 as an inorganic insulating layer. The fourth insulating layer 114 may include a via opening (or a via hole) by which one of the source electrode 123 and the drain electrode 124 is exposed.

The OLED may be located on the fourth insulating layer 114. The OLED may include a pixel electrode 131, an opposite electrode 133 opposite to the pixel electrode 131, and an intermediate layer 132 between the pixel electrode 131 and the opposite electrode 133.

The pixel electrode 131 may be electrically connected to the drain electrode 124 through the via hole. The pixel electrode 131 may be a reflective layer including a reflective conductive material, such as silver (Ag), magnesium (Mg), aluminum (Al), platinum (Pt), palladium (Pd), gold (Au), nickel (Ni), neodymium (Nd), iridium (Ir), chromium (Cr), or a compound thereof. According to an embodiment, the pixel electrode 131 may be a transparent conductive layer including at least one transparent conductive oxide selected from among indium tin oxide (ITO), indium zinc oxide (IZO), zinc oxide (ZnO), indium oxide ($In_2O_3$), indium gallium oxide (IGO), and aluminum zinc oxide (AZO). According to an embodiment, the pixel electrode 131 may be a stack of the reflective layer and the transparent conductive layer.

A fifth insulating layer 115 may be arranged on the fourth insulating layer 114. The fifth insulating layer 115 may cover an edge of the pixel electrode 131, and may define a pixel by including an opening through which a portion of the pixel electrode 131 is exposed. The fifth insulating layer 115 may be an organic insulating layer. The fifth insulating layer 115 may include a polyacrylic compound, a polyimide compound, a fluorocarbon compound (such as, Teflon), a benzocyclobutene compound, and/or the like.

The intermediate layer 132 includes at least an emission layer (EML) and may further include a least one functional layer from among a hole injection layer (HIL), a hole transport layer (HTL), an electron transport layer (ETL), an electron injection layer (EIL), in addition to the EML. The EML may be a red emission layer, a green emission layer, or a blue emission layer. In some embodiments, to emit white light, the EML have a multi-layered structure in which a red emission layer, a green emission layer, and a blue emission layer are stacked, or have a single-layered structure including a red emission material, a green emission material, and a blue emission material.

The opposite electrode 133 may be formed of various suitable conductive materials. For example, the opposite electrode 133 may include a semi-transmissive reflection layer including at least one of lithium (Li), calcium (Ca), lithium fluoride (LiF), aluminum (Al), magnesium (Mg), and silver (Ag), or may include a light-transmitting metal oxide, such as ITO, IZO, or ZnO, and may be formed as a single layer or multiple layers. The opposite electrode 133 may extend to an upper surface of the fifth insulating layer 115 in the display area DA and the non-display area NA, and may contact a first power line 301a and a second power line 301b.

The driving circuit DRV may include at least one transistor that constitutes the above-described controller, the above-described data driving unit, and the above-described scan driving unit. For convenience of explanation, FIG. 3 illustrates that the driving circuit DRV includes a single transistor TFTn. However, embodiments are not limited thereto, and the driving circuit DRV may further include a plurality of transistors and other devices. The transistor TFTn may include a semiconductor layer 201, a gate electrode 202, a source electrode 203, and a drain electrode 204. The transistor TFTn may be a TFT. A cross-sectional structure of the transistor TFTn included in the driving circuit DRV is the same or substantially the same as that of the transistor TFTd included in the pixel PX, and thus a description thereof may not be repeated.

The plurality of power lines included in the power unit may include a second power supply voltage line 301 supplying the second power supply voltage ELVSS to the pixel PX, a first driving voltage line 302 and a second driving voltage line 303 supplying driving voltages to the driving circuit DRV, and at least one direct current (DC) voltage line 304 supplying a DC voltage to the pixel PX and/or the driving circuit DRV. A first driving voltage that is supplied by the first driving voltage line 302 may be higher than a second driving voltage that is supplied by the second driving voltage line 303. The power unit may further include a first power supply voltage line that supplies the first power supply voltage ELVDD. According to an embodiment, the power unit may be located between the driving circuit DRV and the dam DAM. According to another embodiment, at least a portion of the power unit, for example, at least some of the plurality of power lines, may overlap the driving circuit DRV.

The second power supply voltage line 301 may supply the second power supply voltage ELVSS to the pixel PX. The second power supply voltage line 301 may surround the entirety or a portion of the display area DA. The second power supply voltage line 301 may include the first power line 301a and the second power line 301b.

The first power line 301a may be between the first layer 101 and the third layer 103 of the substrate 100. The first power line 301a may be on the second layer 102 of the substrate 100. The first power line 301a may be on the same layer on which the shielding layer 151 is arranged, and may include the same or substantially the same material as that included in the shielding layer 151. The first power line 301a may include at least one of aluminum (Al), copper (Cu), silver (Ag), molybdenum (Mo), chromium (Cr), tungsten (W), titanium (Ti), and an alloy thereof, and may be formed as a single layer or a multi-layer. According to an embodiment, the first power line 301a may be a multi-layered structure including Mo. According to an embodiment, the first power line 301a may be a three-layered structure having a first layer, a second layer, and a third layer sequentially stacked on the second layer 102, the first and third layers including Ti and the second layer including Al.

The third layer 103 and the fourth layer 104 of the substrate 100 may cover an edge of the first power line 301a and may have an opening OP1 through which a portion of the first power line 301a is exposed. The buffer layer 110 and the first through third insulating layers 111 through 113 (hereinafter, referred to as an inorganic insulating layer 116) may cover the edge of the first power line 301a and may have an opening OP2 through which a portion of the first power line 301a is exposed. The inorganic insulating layer 116 may cover upper surfaces of the third layer 103 and the fourth layer 104 and an inner lateral surface of the opening OP1. Although the buffer layer 110 of the inorganic insulating layer 116 contacts the edge of the first power line 301a in FIG. 3, at least one of the layers included in the inorganic insulating layer 116 may contact the edge of the first power line 301a.

The opening OP2 of the inorganic insulating layer 116 may overlap the opening OP1 of the substrate 100. The opening OP2 may be smaller than the opening OP1. The width of the opening OP2 may be narrower than the width of the opening OP1. However, embodiments are not limited thereto, and the inner lateral surface of the opening OP2 may coincide with the inner lateral surface of the opening OP1.

A portion of the edge of the first power line 301a may be covered by the fourth insulating layer 114. The fourth insulating layer 114 may cover a portion of the inner lateral surface of the opening OP2. However, embodiments are not limited thereto, and the fourth insulating layer 114 may exist only outside the opening OP2.

The second power line 301b may be formed on the same layer on which the source and drain electrodes 123 and 124 are formed, and may include the same or substantially the same material as that included in the source and drain electrodes 123 and 124. The fourth insulating layer 114 may include an opening OP3 through which a portion of the second power line 301b is exposed.

The first power line 301a and the second power line 301b may be electrically connected to the opposite electrode 133. The first power line 301a may contact the opposite electrode 133 through the opening OP2, and the second power line 301b may contact the opposite electrode 133 through the opening OP3.

When the second power supply voltage line 301 is arranged as a single power line on the same layer on which one electrode of the driving circuit DRV is arranged in the non-display area NA, a non-display area NA whose width is the same or substantially the same as the width of the second power supply voltage line 301 is needed. However, according to an embodiment, because the second power supply voltage line 301 includes the first power line 301a and the second power line 301b that are on different layers, and the first power line 301a is arranged on a layer under the second power line 301b and the driving circuit DRV, the width of the second power line 301b may be decreased and the width of the first power line 301a may be increased. Accordingly, a degree of freedom of the width of the second power supply voltage line 301 may be increased, and at the same time the non-display area NA may be reduced.

The first and second driving voltage lines 302 and 303 and the DC voltage line 304 may be formed on the same layer on which the first power line 301a is formed, and may include the same or substantially the same material as that included in the first power line 301a.

According to an embodiment, because some power lines of the power unit, for example, the power lines 301a, 302, 303, and 304, are arranged between the first layer 101 and the third layer 103 of the substrate 100, the power lines 301a, 302, 303, and 304 may reduce or minimize an influence of an electric field upon the transistor of the driving circuit DRV.

The dam DAM may be provided at an outermost portion of the non-display area NA. Although the dam DAM is formed of the same or substantially the same material as the fourth insulating layer 114 in a single-layered structure in FIG. 4, embodiments are not limited thereto, and the dam DAM may be formed of the same or substantially the same material as the fourth insulating layer 114 and/or the fifth insulating layer 115 in a single-layered or multi-layered structure.

According to an embodiment, because at least a portion of the power unit is arranged on a layer under the driving circuit DRV, a space where the power unit is arranged may be reduced, and thus the non-display area NA may be reduced. Moreover, because the driving circuit DRV overlaps at least a portion of the power unit, the non-display area NA may be further reduced.

FIGS. 4A through 4G are schematic cross-sectional views illustrating a method of manufacturing the display apparatus 10 of FIG. 3.

Figure 4A:
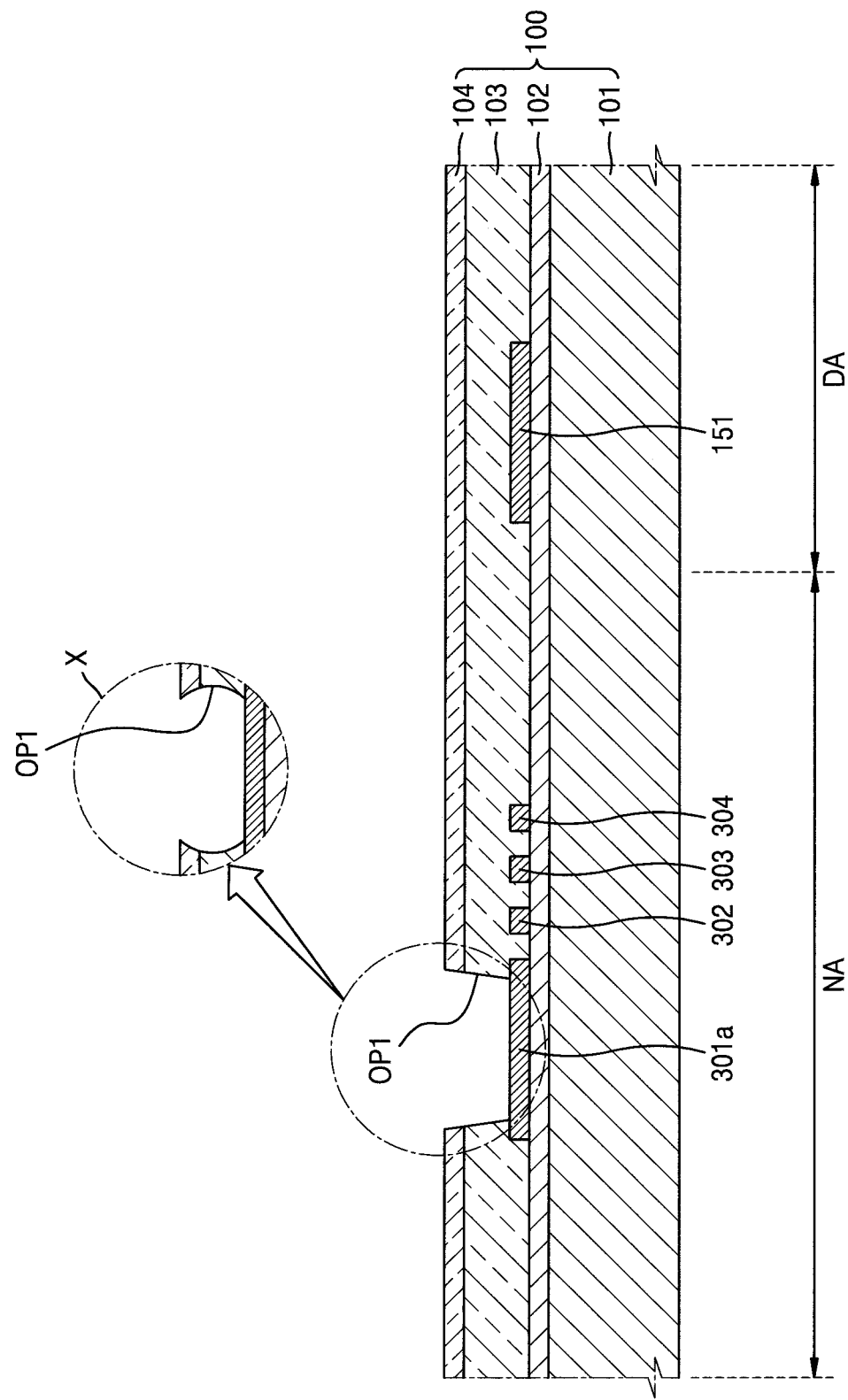

Referring to FIG. 4A, the first layer 101 of an organic material and the second layer 102 of an inorganic material may be sequentially stacked on a support substrate, and the shielding layer 151 of the display area DA and the first power line 301a, the first driving voltage line 302, the second driving voltage line 303, and the DC voltage line 304 included in the power unit of the non-display area NA may be formed on the second layer 102. The support substrate may be removed later.

The third layer 103 of an organic material and the fourth layer 104 of an inorganic material may be sequentially stacked on the shielding layer 151 and the power unit, and then may be patterned to form the opening OP1 through which the upper surface of the first power line 301a is partially exposed.

According to an embodiment, the inner lateral surface of the opening OP1 may be flat. According to another embodiment, the inner lateral surface of the opening OP1 may be concave as shown in the magnified view X. The third layer 103 and the fourth layer 104 are patterned via etching. When the third layer 103 and the fourth layer 104 are over-etched, the inner lateral surface of the opening OP1 may have a concave shape.

The first through fourth layers 101 through 104 will now be referred to as the substrate 100.

Figure 4B:
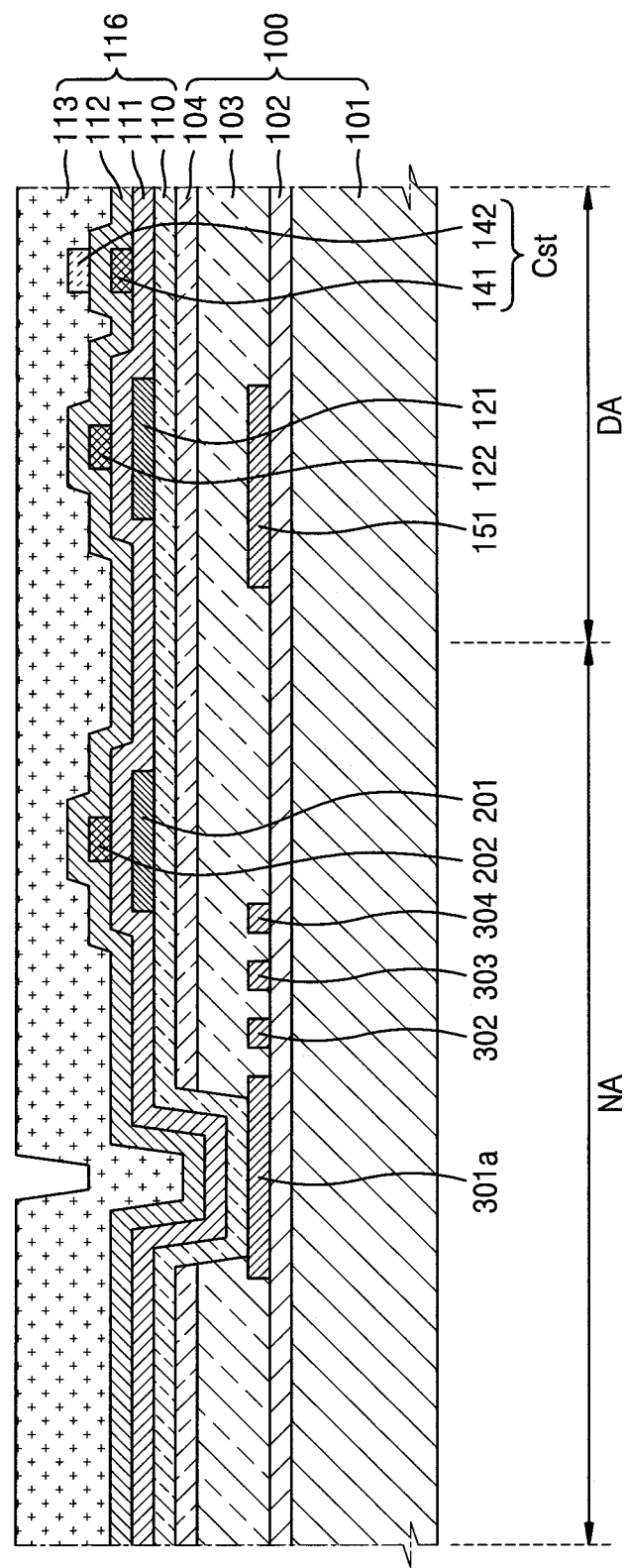

Referring to FIG. 4B, the buffer layer 110 may be formed on the substrate 100, and the semiconductor layer 121 of the transistor TFTd included in the pixel PX and the semiconductor layer 201 of the transistor TFTn included in the driving circuit DRV may be formed on the buffer layer 110.

The first insulating layer 111 may be formed on the semiconductor layers 121 and 201, and the gate electrode 122 of the transistor TFTd, the gate electrode 202 of the transistor TFTn, and the first capacitor electrode 141 of the capacitor Cst may be formed on the first insulating layer 111.

The second insulating layer 112 covering the gate electrodes 122 and 202 and the first capacitor electrode 141 may be formed on the first insulating layer 111, and the second capacitor electrode 142 may be formed on the second insulating layer 112. The third insulating layer 113 may be formed on the second capacitor electrode 142.

Figure 4C:
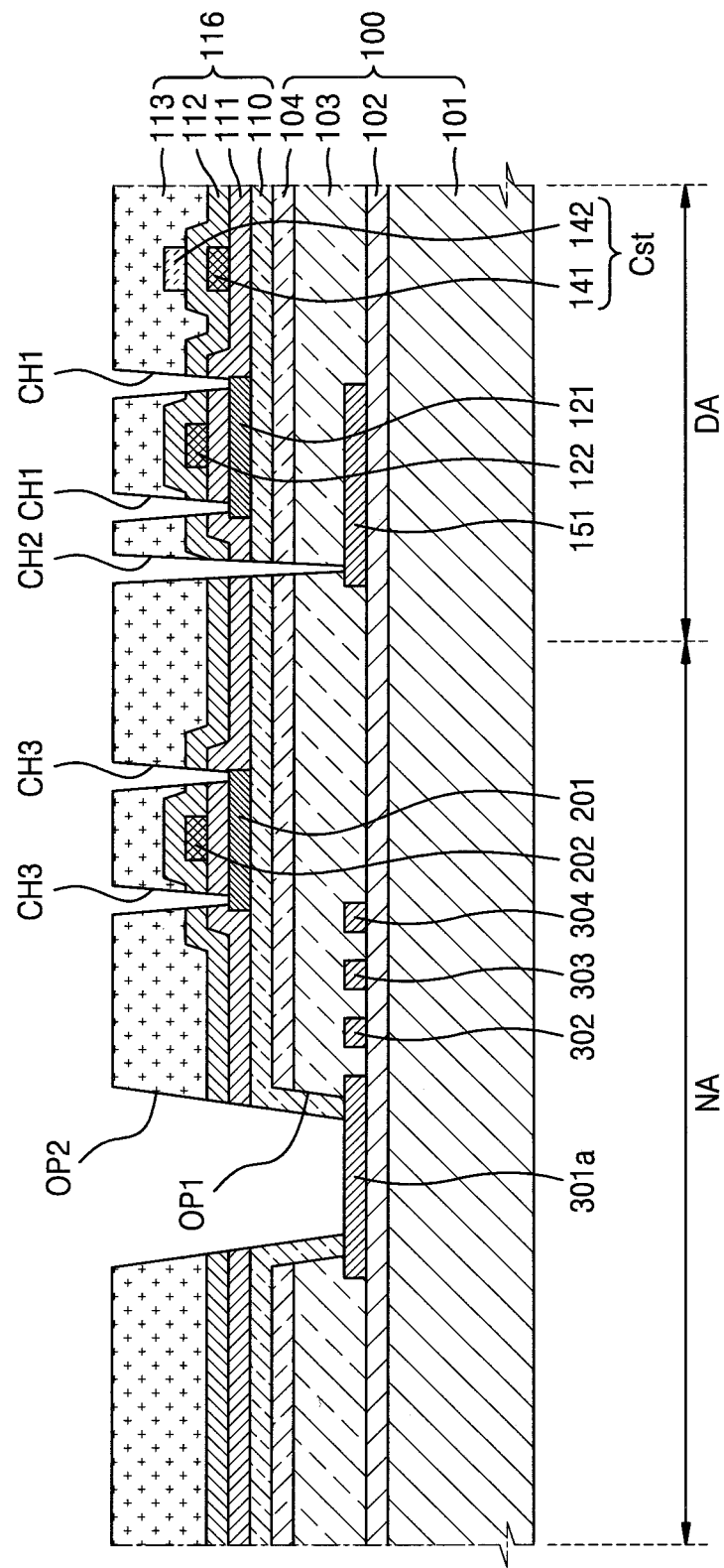

Referring to FIG. 4C, the first through third insulating layers 111 through 113 may be patterned such that contact holes CH1 through which the source region and the drain region of the semiconductor layer 121 are exposed and contact holes CH3 through which a source region and a drain region of the semiconductor layer 201 are exposed are formed in the first through third insulating layers 111 through 113. The third and fourth layers 103 and 104 of the substrate 100 and the inorganic insulating layer 116 may be patterned such that a contact hole CH2 through which an upper surface of the shielding layer 151 is partially exposed is formed in the third and fourth layers 103 and 104 and the inorganic insulating layer 116. The inorganic insulating layer 116 may be patterned such that the opening OP2 through which the upper surface of the first power line 301a is partially exposed is formed in the inorganic insulating layer 116.

Figure 4D:
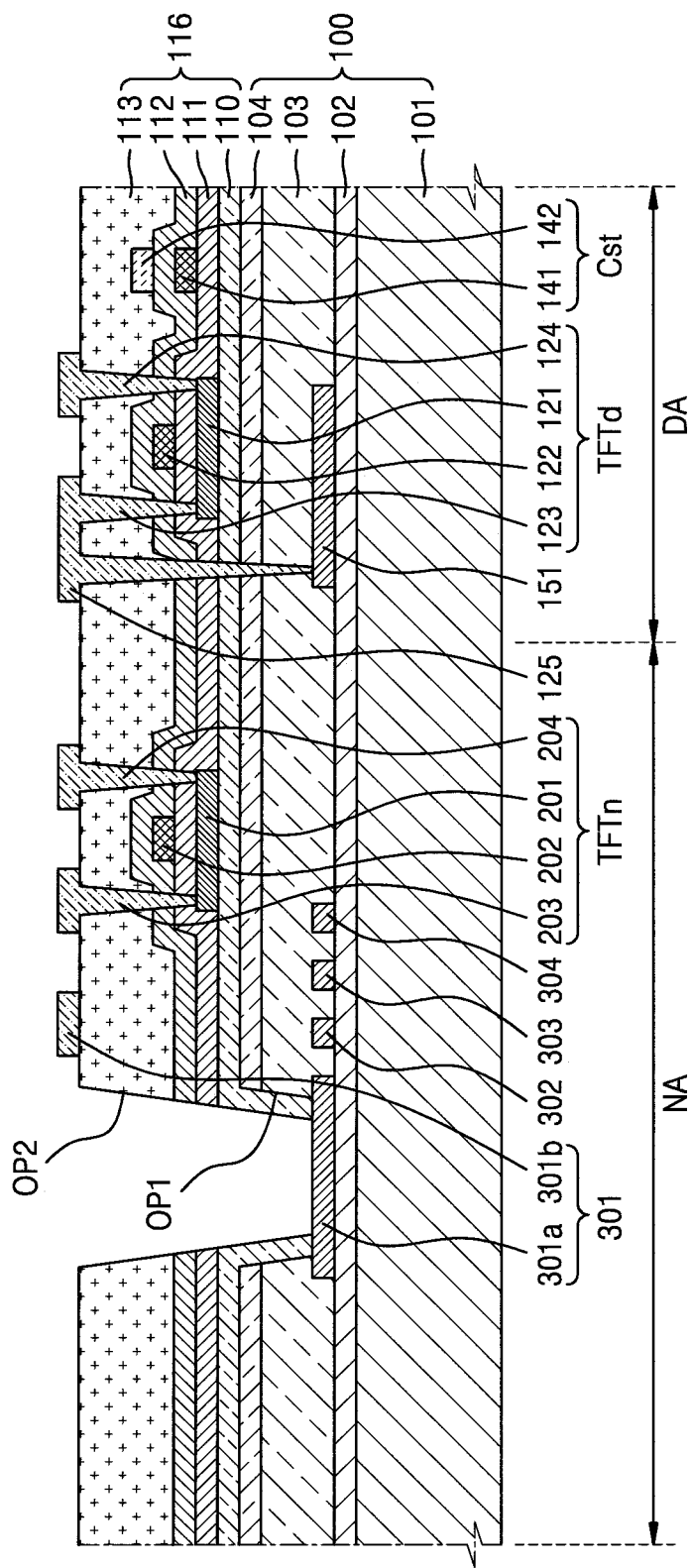

Referring to FIG. 4D, the source electrode 123 and the drain electrode 124 contacting the semiconductor layer 121 of the transistor TFTd through the contact holes CH1, the source electrode 203 and the drain electrode 204 contacting the semiconductor layer 201 of the transistor TFTn through the contact holes CH3, and the second power line 301b may be formed on the third insulating layer 113. The first connecting electrode 125 extending from the source electrode 123 of the transistor TFTd and contacting the shielding layer 151 through the contact hole CH2 may also be formed on the third insulating layer 113.

Figure 4E:
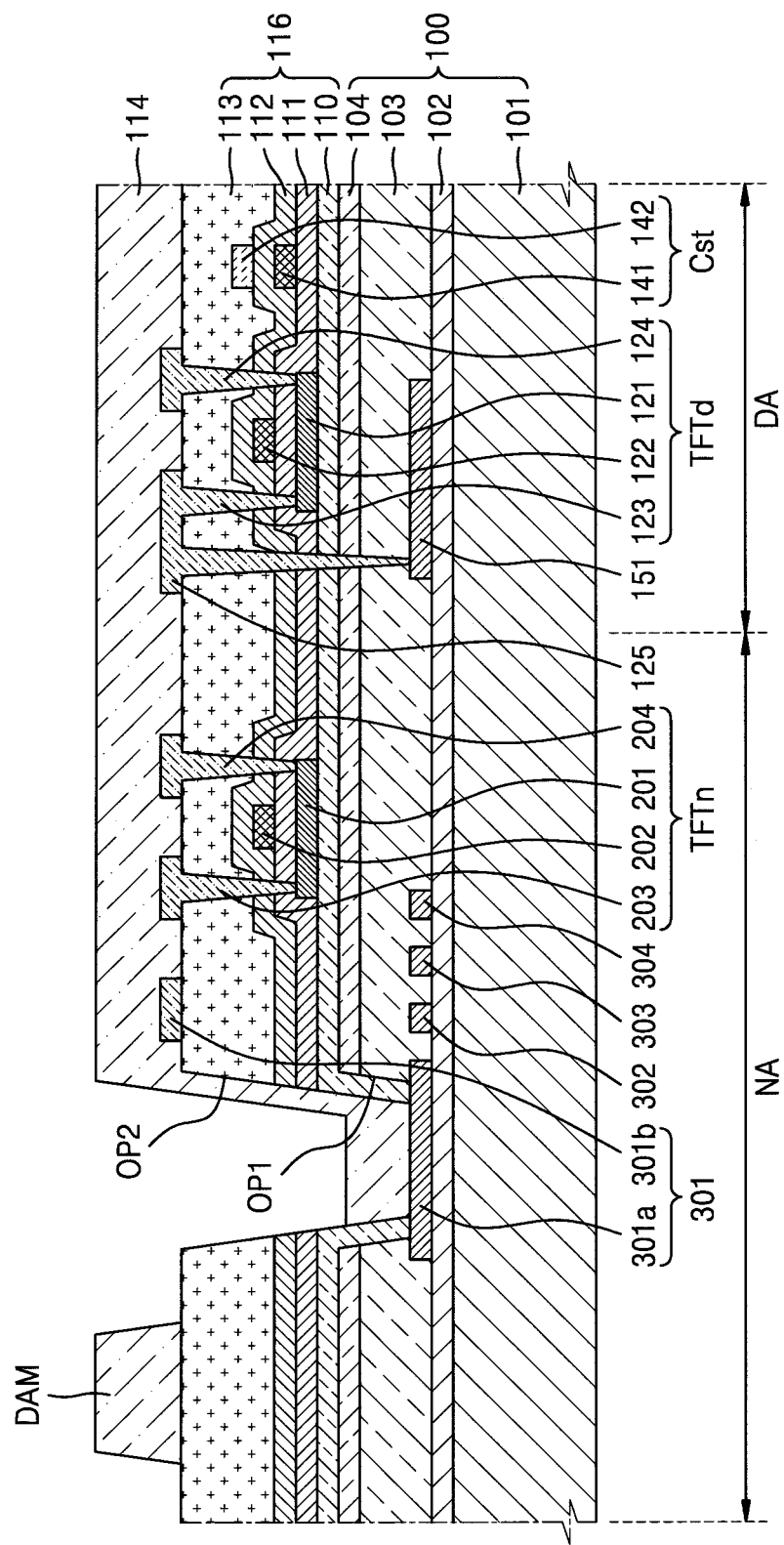

Referring to FIG. 4E, the fourth insulating layer 114 covering the source electrodes 123 and 203, the drain electrodes 124 and 204, the second power line 301b, and at least a portion of the upper surface of the first power line 301a exposed through the opening OP2 may be formed on the third insulating layer 113.

The dam DAM may be formed of a material of the fourth insulating layer 114 on the outermost portion of the substrate 100.

Figure 4F:
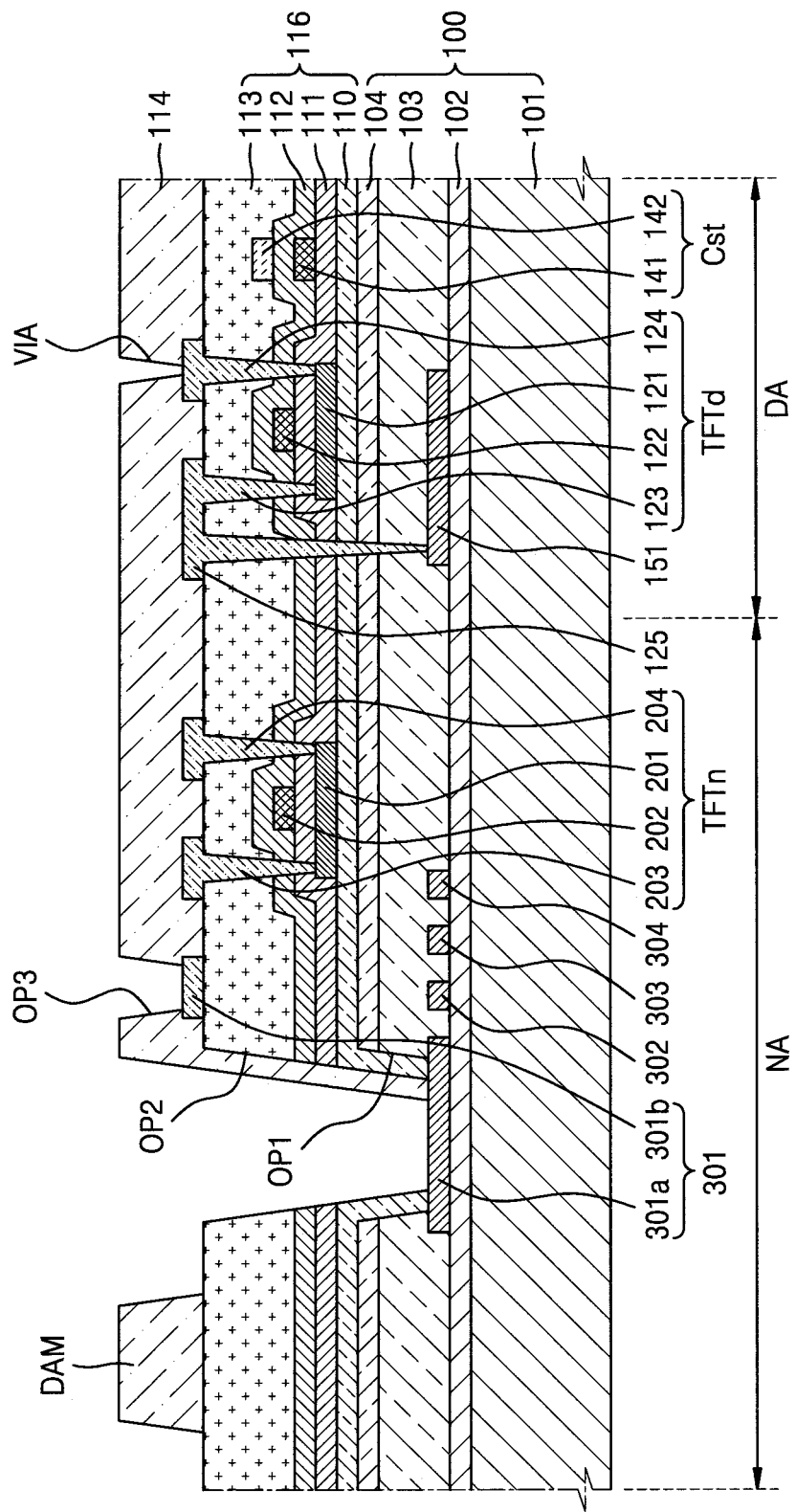

Referring to FIG. 4F, the fourth insulating layer 114 may be patterned such that a via hole VIA exposing a portion of the drain electrode 124 of the transistor TFTd and the opening OP3 exposing a portion of the upper surface of the second power line 301b may be formed in the fourth insulating layer 114. A portion of the fourth insulating layer 114 that exists on the upper surface of the first power line 301a may be removed. The fourth insulating layer 114 may smooth out a step between insulating layers therebelow.

Referring to FIG. 4G, the pixel electrode 131 may be formed on the fourth insulating layer 114, and the fifth insulating layer 115 may be formed on the fourth insulating layer 114 while covering the pixel electrode 131. The fifth insulating layer 115 may be patterned such that an opening OP4 through which a portion of the pixel electrode 131 is exposed may be formed in the fifth insulating layer 115. The fifth insulating layer 115 may not cover the first power line 301a and the second power line 301b.

Thereafter, as illustrated in FIG. 3, the intermediate layer 132 and the opposite electrode 133 may be sequentially formed in the opening OP4 exposing the pixel electrode 131. The opposite electrode 133 may extend up to the non-display area NA, and may contact an upper surface of the second power line 301b exposed through the opening OP3 and an exposed upper surface of the first power line 301a.

FIGS. 5 through 9 are cross-sectional views of display apparatuses according to other embodiments, taken along the line I-I' of FIG. 1. Configurations that are the same as those according to the above-described embodiments may not be described herein.

Figure 5:
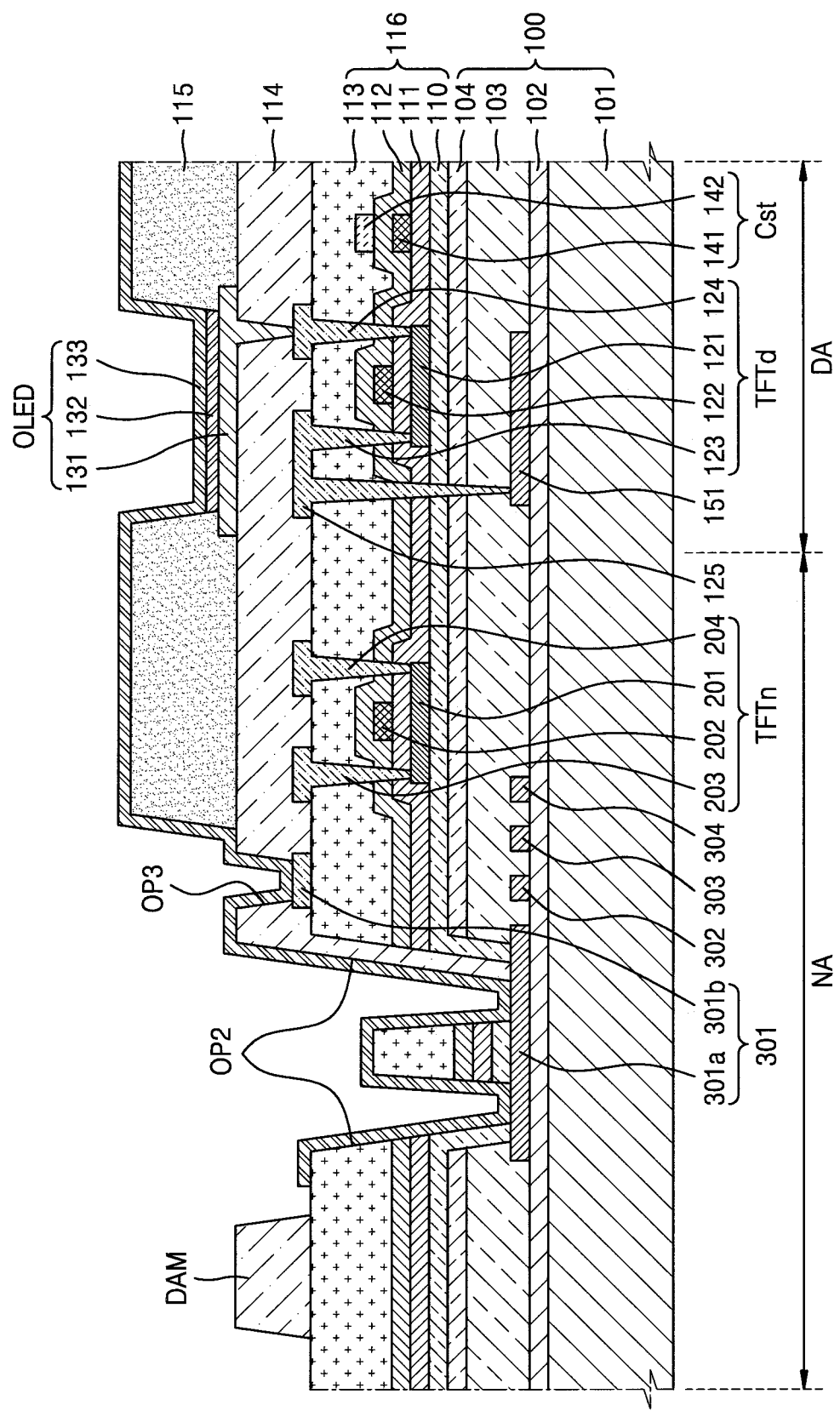
FIGS. 5-9 are cross-sectional views of display apparatuses according to other example embodiments, taken along the line I-I' of FIG. 1.

The embodiment of FIG. 5 is different from that of FIG. 3 in that two or more openings OP2 are included in a portion of the inorganic insulating layer 116 that exists on the first power line 301a. The opposite electrode 133 may contact the first power line 301a through the two or more openings OP2. A partial lateral surface of the openings OP2 may be covered by the fourth insulating layer 114.

Figure 6:
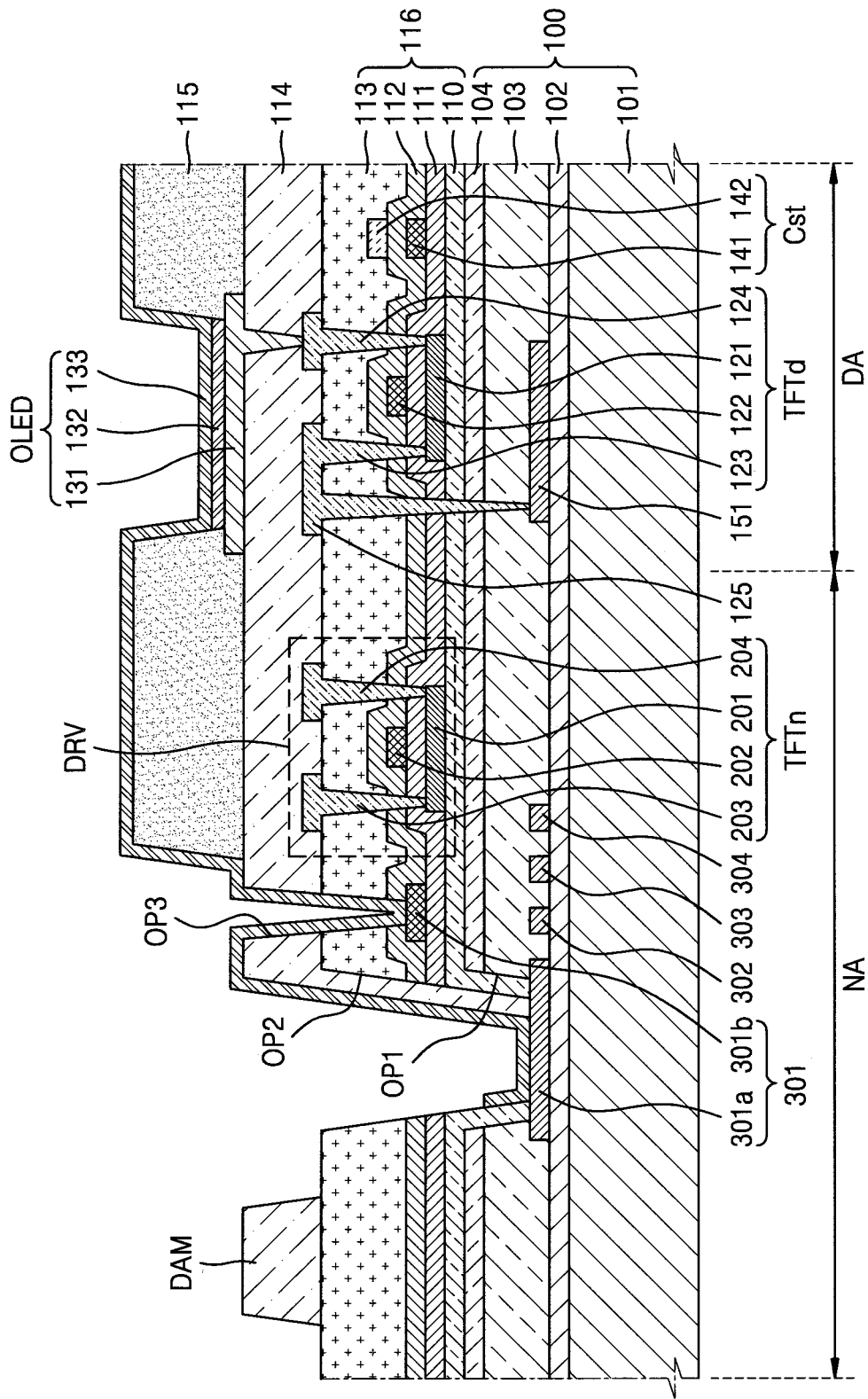

The embodiment of FIG. 6 is different from that of FIG. 3 in that the second power line 301b is on the same layer on which the gate electrode 202 of the transistor TFTn included in the driving circuit DRV is located. In the embodiment of FIG. 3, the second power line 301b is on the same layer on which the source electrode 203 and the drain electrode 204 of the transistor TFTn included in the driving circuit DRV are located.

Referring to FIG. 6, the second power line 301b may be formed on the same layer on which the gate electrode 202 of the transistor TFTn included in the driving circuit DRV is formed, and may include the same or substantially the same material as that included in the gate electrode 202. In the second through fourth insulating layers 112 through 114, the opening OP3 exposing a portion of the upper surface of the second power line 301b may be formed. An electrode layer extending from the opposite electrode 133 may contact the second power line 301b through the opening OP3 and may contact the exposed upper surface of the first power line 301a.

Figure 7:
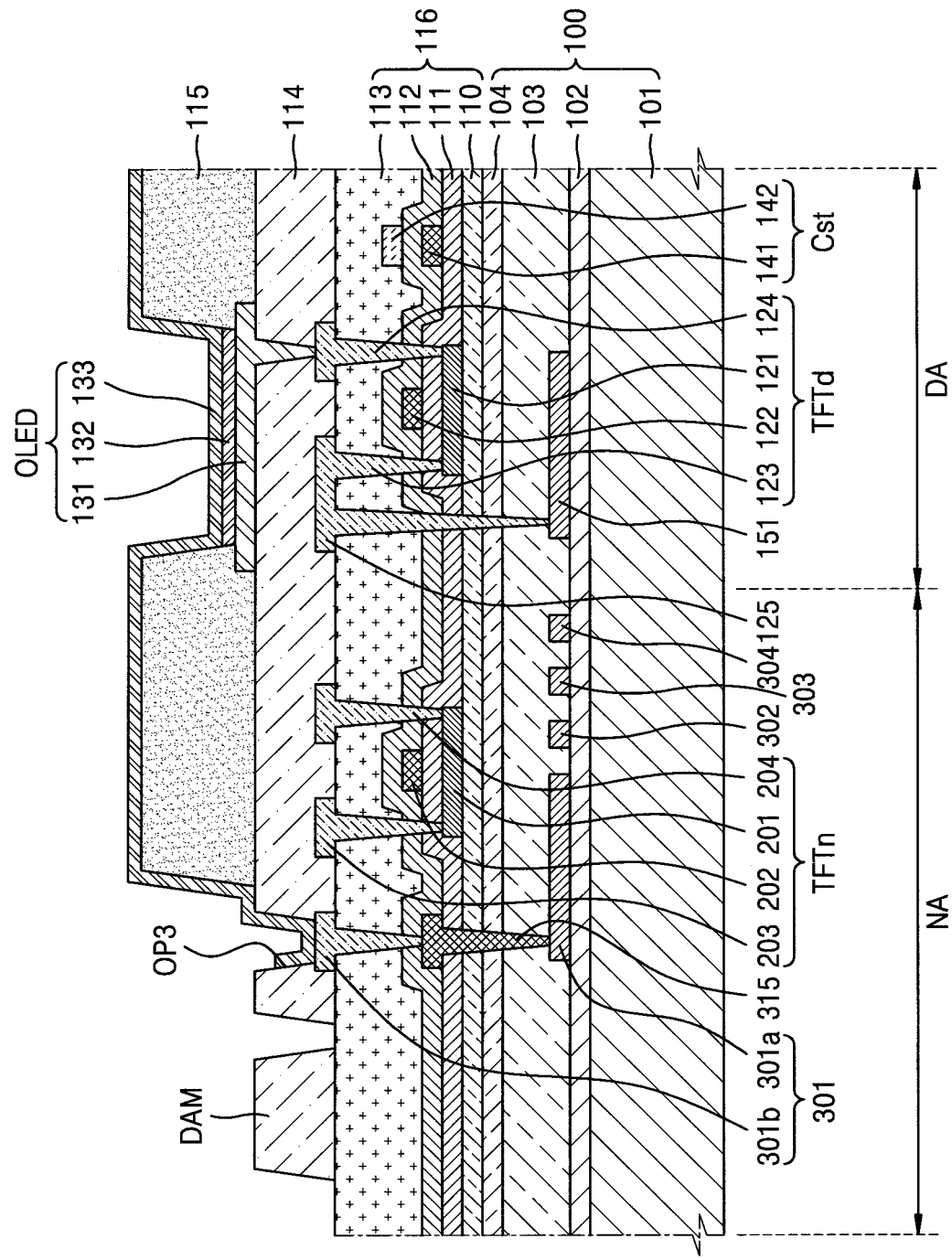

The embodiment of FIG. 7 is different from that of FIG. 3 in that a second connecting electrode 315 is electrically connected to the first power line 301a and the second power line 301b and the opposite electrode 133 contacts the second power line 301b. The second connecting electrode 315 may be formed of the same or substantially the same material as that used to form the gate electrodes 122 and 202, on the same layer on which the gate electrodes 122 and 202 are formed. The second connecting electrode 315 may be arranged on the first insulating layer 111. The second connecting electrode 315 may contact the first power line 301a through a contact hole that exposes the first power line 301a by patterning the third and fourth layers 103 and 104 of the substrate 100, the buffer layer 110, and the first insulating layer 111. The second power line 301b may contact the second connecting electrode 315 through a contact hole that exposes the second connecting electrode 315 by patterning the second and third insulating layers 112 and 113.

Although the second power line 301b overlaps the second connecting electrode 315 and the first power line 301a in the embodiment of FIG. 7, embodiments are not limited thereto. For example, the second connecting electrode 315 may or may not overlap the first power line 301a, and the second power line 301b may or may not overlap at least one of the second connecting electrode 315 and the first power line 301a.

Figure 8:
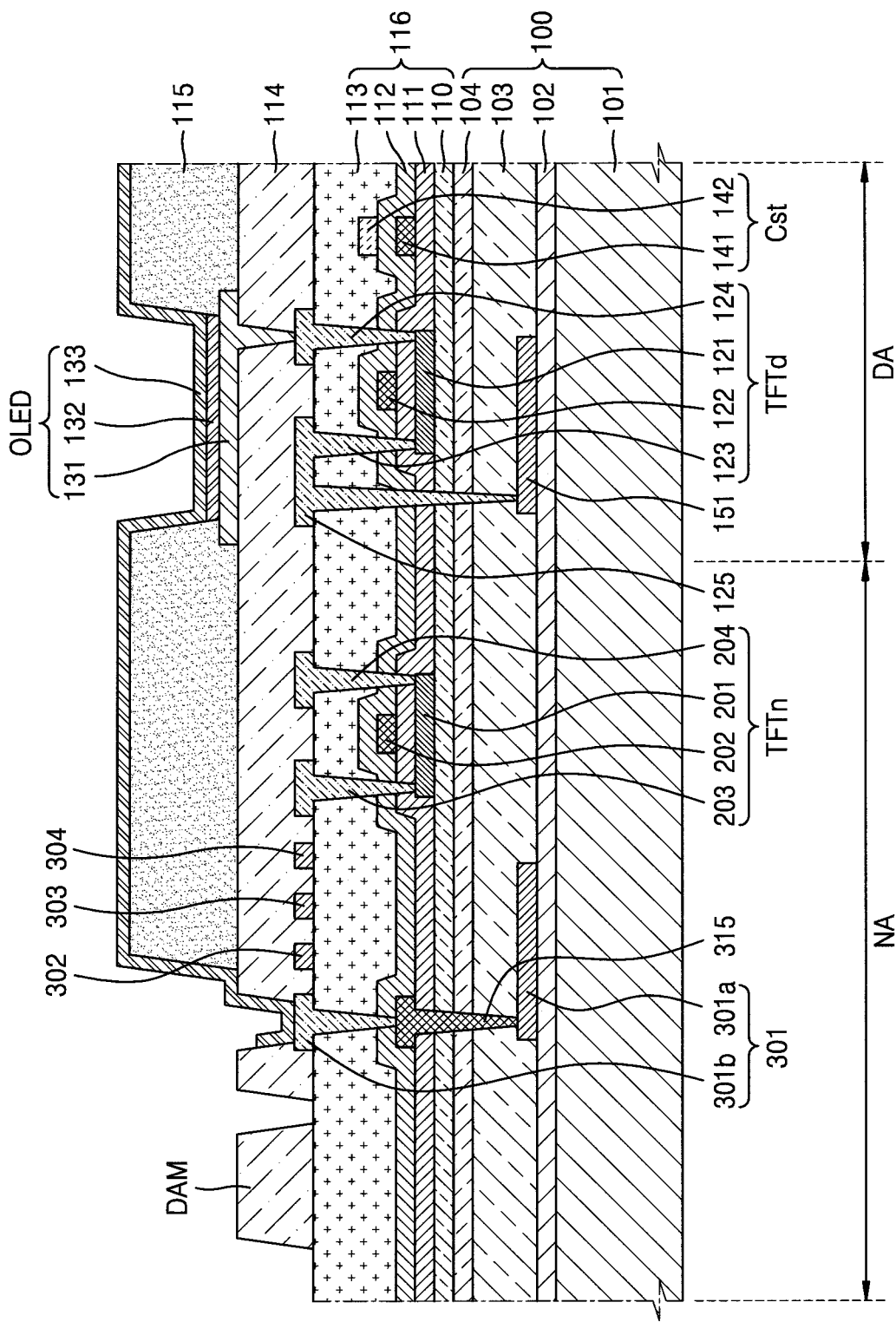

The embodiment of FIG. 8 is different from that of FIG. 6 in that the first power line 301a is on the same layer on which the shielding layer 151 is located, and the second power line 301b, the first driving voltage line 302, the second driving voltage line 303, and the DC voltage line 304 are on the same layer on which the source electrodes 123 and 203 and the drain electrodes 124 and 204 are located.

At least some of the power lines arranged on the same layer on which the source electrodes 123 and 203 and the drain electrodes 124 and 204 are arranged may overlap a portion of the first power line 301a.

Figure 9:
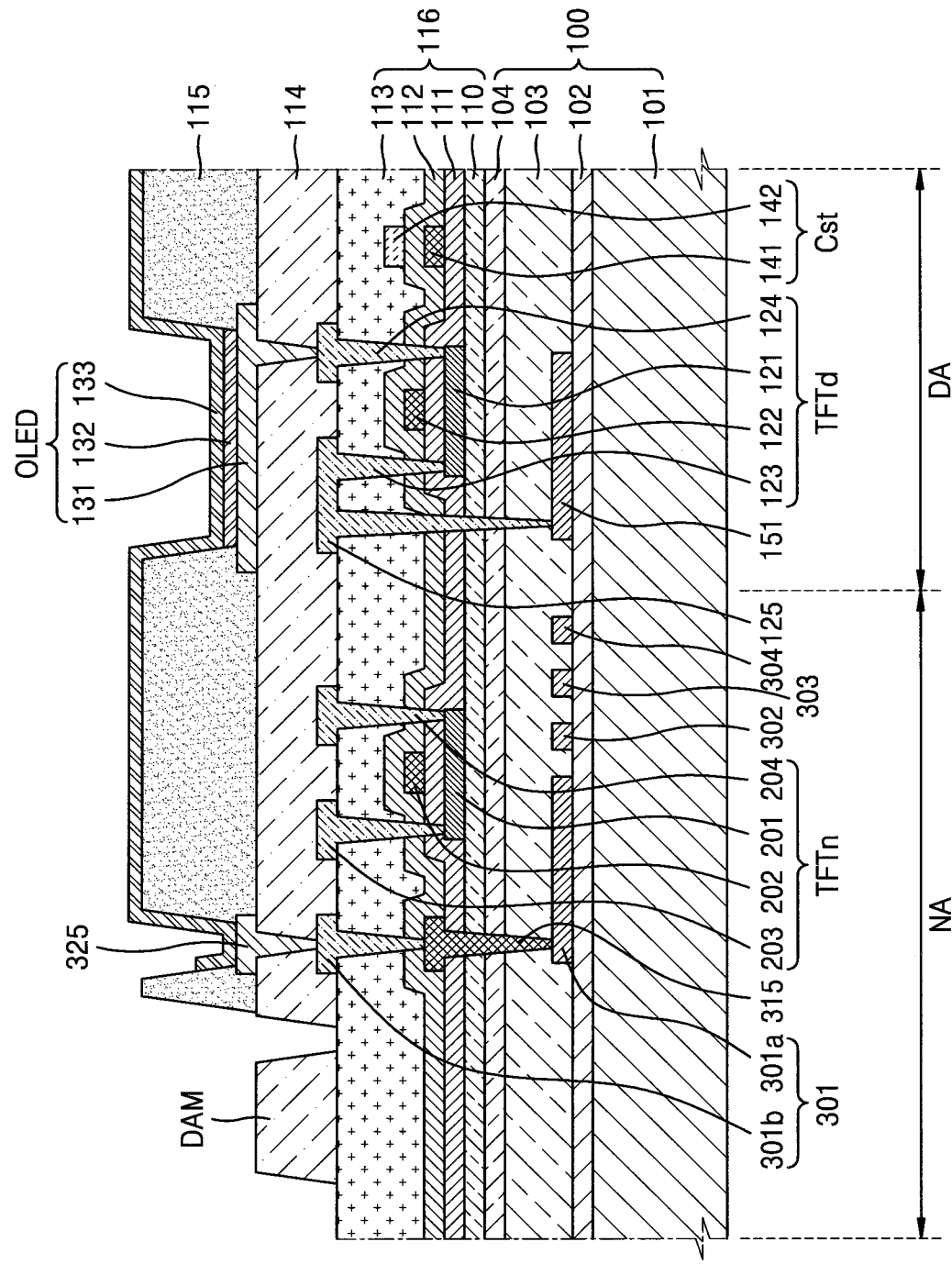

The embodiment of FIG. 9 is different from that of FIG. 7 in that the second connecting electrode 315 is electrically connected to the first power line 301a and the second power line 301b and a third connecting electrode 325 is electrically connected to the opposite electrode 133 and the second power line 301b.

The third connecting electrode 325 may be formed of the same or substantially the same material as that used to form the pixel electrode 131, on the same layer on which the pixel electrode 131 is formed. The third connecting electrode 325 may be arranged on the fourth insulating layer 114. The third connecting electrode 325 may contact the second power line 301b through a contact hole that exposes the second power line 301b by patterning the fourth insulating layer 114. The third connecting electrode 325 may contact the opposite electrode 133 through a contact hole that exposes the third connecting electrode 325 by patterning the fifth insulating layer 115. Accordingly, the first power line 301a and the second power line 301b may be electrically connected to the opposite electrode 133. The third connecting electrode 325 may or may not overlap at least one of the second power line 301b, the second connecting electrode 315, and the first power line 301a.

According to embodiments, a non-display area may be reduced by arranging at least some of the power lines of the non-display area on a layer below a driving circuit.

Thus, a display apparatus having a reduced or minimized non-display area may be provided.

It should be understood that embodiments described herein should be considered in a descriptive sense only and not for the purpose of limiting the invention. Descriptions of features or aspects within each embodiment should generally be considered as available for other similar features or aspects in other embodiments, unless stated otherwise.

While one or more embodiments have been described with reference to the figures, it will be understood by those of ordinary skill in the art that various suitable changes in form and details may be made therein without departing from the spirit and scope of the present invention, as defined by the following claims and equivalents thereof.

What is claimed is:

1. A display apparatus having a display area and a non-display area around the display area, the display apparatus comprising, in the non-display area:
   a first power line;
   a driving circuit on a layer over the first power line; and
   a second power line electrically connected to the first power line and on a same layer on which one electrode of the driving circuit is arranged.

2. The display apparatus of claim 1, further comprising:
   a display device in the display area and comprising a pixel electrode, an opposite electrode, and an emission layer between the pixel electrode and the opposite electrode.

3. The display apparatus of claim 2, wherein the opposite electrode is electrically connected to the first power line and the second power line.

4. The display apparatus of claim 1, wherein the first power line overlaps a portion of the driving circuit.

5. The display apparatus of claim 1, wherein the second power line overlaps a portion of the first power line.

6. The display apparatus of claim 1, wherein the driving circuit comprises at least one thin film transistor, and wherein the second power line is on a same layer on which at least one of a gate electrode, a source electrode, and a drain electrode of the at least one thin film transistor of the driving circuit is arranged.

7. The display apparatus of claim 1, further comprising:
   a first connecting electrode on a layer between the first power line and the second power line, the first connecting electrode electrically connecting the first power line to the second power line.

8. The display apparatus of claim 2, further comprising:
   a second connecting electrode on a layer over the second power line and electrically connecting the second power line to the opposite electrode.

9. The display apparatus of claim 1, further comprising, in the display area:
   a shielding layer on a same layer on which the first power line is arranged; and
   a pixel circuit on a layer over the shielding layer and at least partially overlapping the shielding layer.

10. The display apparatus of claim 9, wherein the shielding layer is electrically connected to one electrode of the pixel circuit.

11. The display apparatus of claim 1, further comprising:
    an organic layer and an inorganic layer between the first power line and the driving circuit.

12. The display apparatus of claim 1, further comprising:
    a third power line being apart from the first power line on a same layer on which the first power line is arranged.

13. The display apparatus of claim 1, further comprising:
    a fourth power line apart from the second power line on a same layer on which the second power line is arranged.

14. A display apparatus comprising:
    a substrate comprising a display area and a non-display area;
    a pixel on the display area and comprising a pixel circuit and a display device;
    at least one power line on the non-display area; and
    a driving circuit on the non-display area and at least partially overlapping the at least one power line,
    wherein the at least one power line is disposed below the driving circuit.

15. The display apparatus of claim 14, wherein the at least one power line comprises:
    a first power line on a layer below the driving circuit; and
    a second power line on a same layer on which one electrode of the driving circuit is arranged, and electrically connected to the first power line.

16. The display apparatus of claim 15, wherein the first power line and the second power line are electrically connected to one electrode of the display device of the pixel.

17. The display apparatus of claim 15, wherein the driving circuit comprises at least one thin film transistor, and
    wherein the second power line is on a same layer on which at least one of a gate electrode, a source electrode, and a drain electrode of the at least one thin film transistor of the driving circuit is arranged.

18. The display apparatus of claim 15, further comprising:
    a connecting electrode between the first power line and the second power line and electrically connect the first power line to the second power line.

19. The display apparatus of claim 15, wherein the substrate comprises:
    a first organic layer;
    a first inorganic layer on the first organic layer;
    a second organic layer on the first inorganic layer; and
    a second inorganic layer on the second organic layer, wherein the first power line is between the first organic layer and the second organic layer, and wherein the driving circuit is over the second inorganic layer.

20. The display apparatus of claim 15, further comprising:

a shielding layer on a layer below the pixel, wherein the shielding layer is on a same layer on which the first power line is arranged.

\* \* \* \* \*